(12) United States Patent
Lojek

(10) Patent No.: US 6,346,443 B1
(45) Date of Patent: Feb. 12, 2002

(54) NON-VOLATILE SEMICONDUCTOR MEMORY DEVICE

(76) Inventor: Bohumil Lojek, 16, Scenic Terrasse, Round Rock, TX (US) 78664

( * ) Notice: Subject to any disclaimer, the term of this patent is extended or adjusted under 35 U.S.C. 154(b) by 0 days.

(21) Appl. No.: 09/337,513

(22) Filed: Jun. 22, 1999

(Under 37 CFR 1.47)

(30) Foreign Application Priority Data

Jun. 26, 1998 (EP) ............................................. 98111779

(51) Int. Cl.[7] ........................................... H01L 21/336
(52) U.S. Cl. ..................... 438/259; 438/257; 438/258; 438/262
(58) Field of Search ................................ 438/259, 258, 438/201, 211, 257, 262; 257/316

(56) References Cited

U.S. PATENT DOCUMENTS

| | | | |
|---|---|---|---|
| 4,686,552 A | * 8/1987 | Teng et al. | 257/68 |
| 4,814,840 A | 3/1989 | Kameda | 257/316 |
| 4,890,144 A | * 12/1989 | Teng et al. | 257/66 |
| 4,975,383 A | * 12/1990 | Baglee | 438/258 |
| 4,979,004 A | 12/1990 | Esquivel et al. | 257/316 |
| 5,141,886 A | * 8/1992 | Mori | 438/259 |
| 5,204,281 A | * 4/1993 | Pfiester | 438/245 |
| 5,661,055 A | * 8/1997 | Hsu et al. | 438/259 |
| 5,753,554 A | * 5/1998 | Park | 438/296 |
| 5,773,343 A | * 6/1998 | Lee et al. | 438/259 |
| 5,854,501 A | * 12/1998 | Kao | 257/316 |
| 5,888,868 A | * 3/1999 | Yamazaki et al. | 438/258 |

FOREIGN PATENT DOCUMENTS

| | | | |
|---|---|---|---|
| DE | 196 04 260 A1 | 8/1997 | |
| EP | 0562307 A2 | * 9/1993 | ......... H01L/27/115 |

OTHER PUBLICATIONS

S. Wolf, "Silicon Processing for the VLSI Era: vol. 2—Process Integration", Lattice Press, 1990 pp. 45–48.*

* cited by examiner

Primary Examiner—Eddie Lee
Assistant Examiner—José R Díaz
(74) Attorney, Agent, or Firm—Griffin & Szipl, P.C.

(57) ABSTRACT

The present invention relates to a method of forming a non-volatile memory device such as an EEPROM device. The non-volatile memory device is formed of an array of memory cells (10) organized into rows (20) and columns (22) within a semiconductor substrate (100). Each cell (10) comprises a gate structure (120) formed of a first dielectric layer (122), a floating gate (124), a second dielectric layer (126) and a control gate (128) formed in a well (50). The memory device further comprises insulating trenches (200) formed in said substrate (100) along a direction parallel to said columns (22) and isolating each cell (10) within a column (22) from other cells (10) within adjacent columns (22).

3 Claims, 7 Drawing Sheets

NON-VOLATILE SEMICONDUCTOR MEMORY DEVICE

FIELD OF THE INVENTION

The present invention relates generally to the field of semiconductor devices. In particular, the present invention relates to non-volatile semiconductor memory devices such as electrically erasable and programmable read-only memory (EEPROM) devices and flash EEPROM devices.

BACKGROUND OF THE INVENTION

An electrically erasable and programmable read-only memory (EEPROM) device typically comprises an array of M×N floating gate cells that may be individually addressed in order to be programmed, read or erased. As shown in FIG. 1, each cell typically comprises a source S and a drain D, e.g. n-type regions, formed in a semiconductor substrate 2, e.g. a p-type substrate. A channel CH is disposed between the source S and the drain D. Each cell further comprises a gate structure which is commonly formed of a floating gate FG overlying the channel CH, and a control gate CG overlying the floating gate FG. The floating gate FG is separated from the surface of the semiconductor substrate 2 by a first thin dielectric layer 4, also referred as the "tunnel oxide", and is isolated from the control gate CG by a second dielectric layer 6.

As shown in the schematic diagram of FIG. 2, the individual memory cells forming the array are organized into rows and columns. Individual word lines WL (WL/1 to WL/M) form control gate CG of each cell within a row, and respective bit lines BL (BL/1 to BL/N) electrically connect the drain D of each cell within a column. Each cell within a column further shares source S and drain D with adjacent cells. By activating the corresponding word WL and bit BL lines, each cell may thus be individually addressed in order to be programmed or read. The source S of each cell within the array may be connected to a common source line CS as illustrated in FIG. 2. This particular feature allows the erasure of every memory cells within the array simultaneously, i.e. in one "flash" operation. The memory device which is illustrated in FIG. 2 is therefore known as a flash EEPROM. Alternatively, the source S of each cell within a column may be connected to additional bit lines as in conventional EEPROM devices.

Each cell may be charged or discharged, i.e. programmed or erased, by appropriately injecting electrons into or withdrawing electrons from the floating gate FG. Charging and discharging of the floating gate FG occurs by tunnelling effects through the first thin dielectric layer 4. Charging the floating gate FG will generally raise the threshold voltage VT of the cell, thus also the voltage VG that must be applied to the control gate CG in order to create a conductive path between source S and drain D. Thus, by applying a voltage to the control gate CG which is greater than the threshold voltage of a discharged cell but lower than the threshold voltage of a charged cell, the state of the cell can be determined by sensing the current flowing between drain D and source S of the memory cell. Accordingly, an unprogrammed cell will conduct, representing the logic state "zero", whereas a programmed cell will not conduct, representing the logic state "one".

The performance of the cell, i.e. the ability to perform programming and erasing operation, is essentially related to the capacitive coupling existing between control gate CG and floating gate FG. Maximizing this capacitive coupling will facilitate programming and erasing of the cell. This implies increasing the capacitance between the floating gate FG and the control gate CG. One will thus seek to increase the surface area between the floating gate FG and the control gate CG. However one will also wish to reduce the surface area of the memory device in order to increase the density of the device and reduce the costs of manufacture. In order to achieve both of these contradictory objectives, there is known from the prior art to form a memory cell in a trench structure. For instance, U.S. Pat. No. 4,979,004 discloses a method of forming an electrically programmable read-only memory (EPROM) device comprising a plurality of trenched memory cells. The capacitive coupling between the floating gate and the control gate is increased whereas the surface area is kept minimal because the two gates overlap each other vertically in the trench.

The method disclosed in this patent can be applied to form electrically erasable and programmable read-only memory (EEPROM) devices but has however some drawbacks. In particular, prior to the etching processes which are ultimately performed in order to form the individual cells, the first dielectric layer and the first conductive layer of each cell within a column therefore form a continuous lining along the trench interior. After the formation of the second dielectric layer and the second conductive layer, an anisotropic etching process is thus performed in order to form the respective gate structures and word lines. Consequently, in order to separate each memory cell within a trench, i.e. within a column, the etching process has to be performed until the first dielectric layer lying at the bottom of the trench is reached. Despite the use of highly anisotropic etching processes, defects will be induced in the dielectric layers eventually causing current leakage problems between the control gate and the floating gate and between the floating gate and the substrate, thus impairing the performance and data endurance of the memory device. In the case of EEPROM devices, it is more than likely that these problems will appear as the first dielectric layer, i.e. the tunnel oxide, is very thin so that the tunnelling effect can occur.

SUMMARY OF THE INVENTION

Thus, the present invention has as a purpose to overcome the inconveniences of the prior art and to provide a method of forming an EEPROM device which has improved performances and reduced surface area.

The present invention also has as a purpose to provide a method of forming an EEPROM device which is more reliable than that known from the prior art.

To this effect, the present invention has as object a method of forming a non-volatile memory device according to claim 1.

An advantage of the present invention lies in the fact that the surface area of the memory device is substantially reduced. Indeed, due to the fact that each memory cell is formed in a well, the whole surface of the memory device is reduced.

Another advantage of the present invention lies in the fact that the costs of manufacture of the semiconductor device are reduced.

Another advantage of the present invention lies in the fact that the capacitive coupling between the floating gate and the control gate of the memory cells is improved. Indeed, the control gate overlaps the floating gate along the sidewalls of the well, thereby increasing the capacitance between the two gates. Accordingly, the performances of the memory device are improved.

Still another advantage of the present invention lies in the fact that the memory cells are more reliable than those of the prior art because they are formed in wells rather than trenches. The drawbacks of the prior art method are thus avoided.

BRIEF DESCRIPTION OF THE DRAWINGS

Other characteristics and advantages of the present invention will appear in the following description given only by way of example and made by referring to the drawings in which:

FIGS. 3a to 8a are cross-sectional views corresponding to FIGS. 3 to 5 and 7 taken along line I—I;

FIGS. 3b to 8b are cross-sectional views corresponding to FIGS. 3 to 5 and 7 taken along line II—II.

DESCRIPTION OF THE INVENTION

Figure 1:
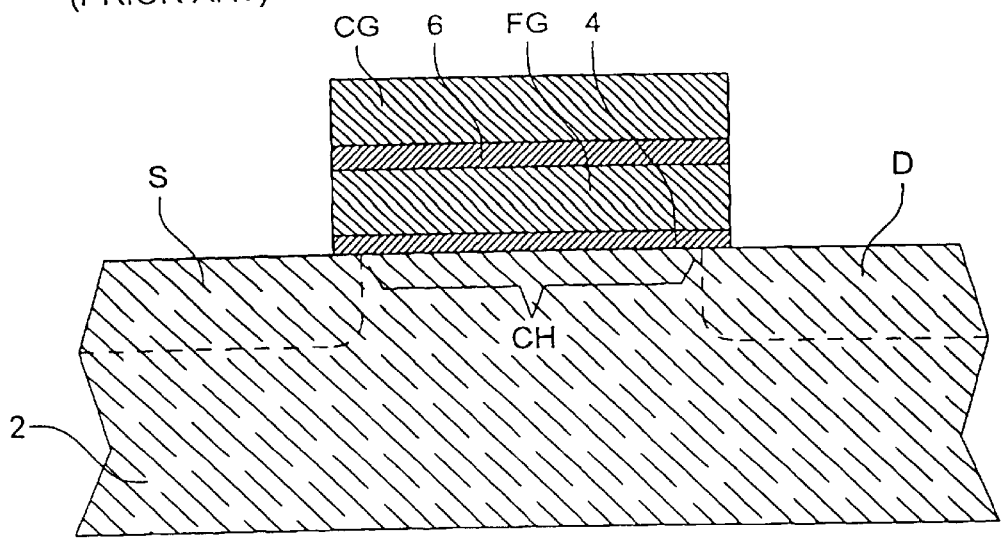
FIG. 1 illustrates a non-volatile memory cell of the prior art.
Figure 2:
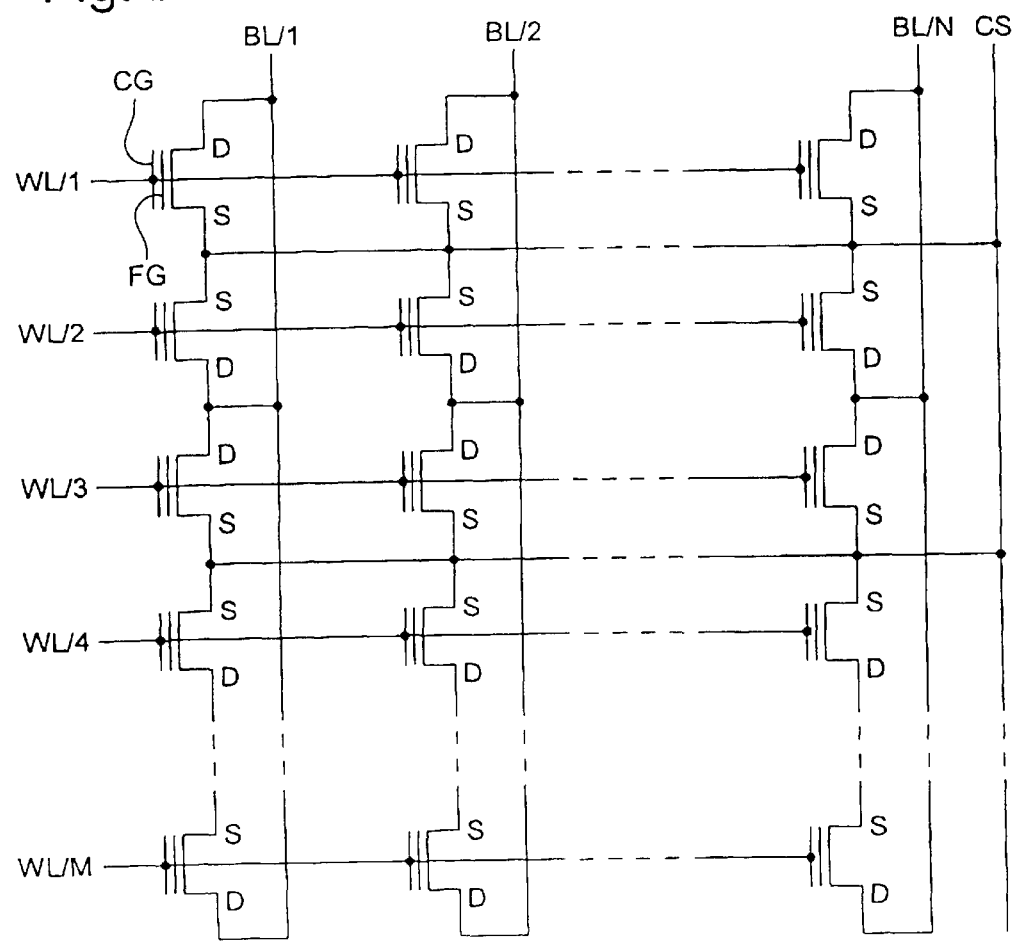
FIG. 2 is a schematic diagram of an array of memory cells forming an EEPROM device.
Figure 3:
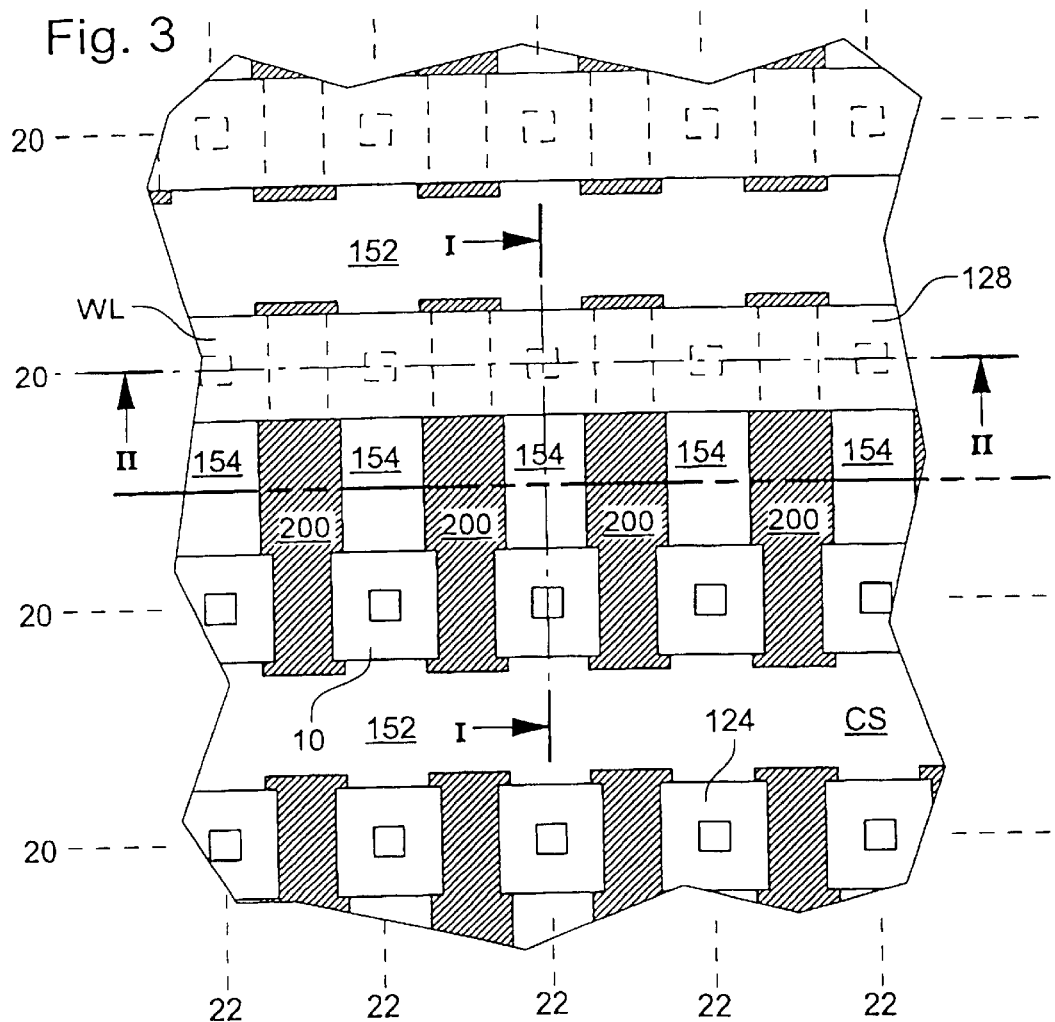
FIGS. 3 to 5 and 7 are plan views illustrating different stages in the formation of an EEPROM device according to the present invention.
Figure 3A:
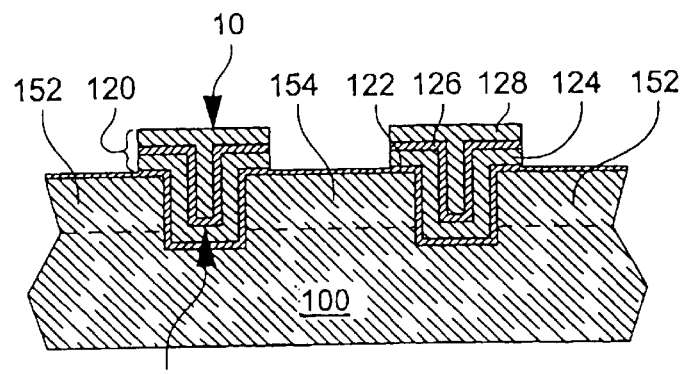
Figure 3B:
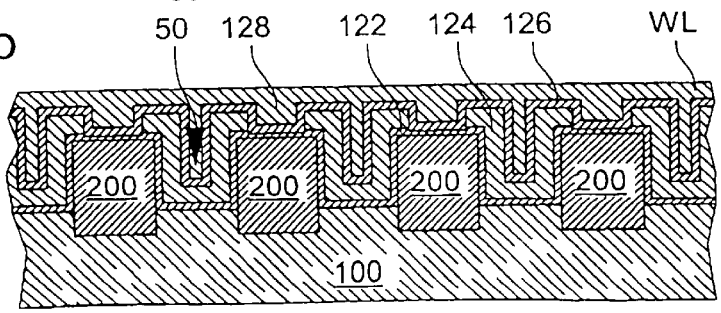

FIG. 3 illustrates a partial plan view of an embodiment of an EEPROM device according to the present invention. The device is formed of an array of EEPROM cells 10 organized into rows 20 and columns 22. FIGS. 3a and 3b are cross-sectional views of the EEPROM array taken respectively along line I—I parallel to rows 20 and line II—II parallel to columns 22 as shown in FIG. 3. Insulating trenches 200 are formed in a semiconductor substrate 100 along a direction parallel to columns 22. Source 152 and drain 154 formed in the semiconductor substrate 100 are alternated between the cells 10 along each column 22. The insulating trenches 200 are interrupted at periodic intervals so that the source 152 of each cell 10 within rows 20 is connected to a common source line CS. It should be pointed out that this feature is not limitative and is only required to form so-called flash EEPROM devices. The insulating trenches 200 may nevertheless be continuous and separate each source 152 along rows 20 so as to form conventional EEPROM devices in which the EEPROM cells 10 are erased individually.

As shown in FIGS. 3a and 3b, each cell 10 is formed in a well 50 and comprises a first thin dielectric layer 122 of approximately 50–100 Angstroms disposed at least over the surface of the well 50. A gate structure 120 comprising a floating gate 124, a control gate 128 and a second dielectric layer 126 isolating the floating gate 124 from the control gate 128 is formed inside each well 50.

It is to be pointed out that, for sake of clarity, the first dielectric layer 122 is not shown on the plan view of FIG. 3 so that the underlying insulating trenches 200, as well as the source 152 and drain 154 regions may clearly be seen. This applies also for the plan view illustrated in FIG. 7.

As shown in the upper part of FIG. 3 and in FIG. 3b, the control gates 128 of each cell 10 within a row 20 are formed integral to individual word lines WL. In the lower part of FIG. 3, these word lines WL and the second dielectric layer 126 have not been drawn so as to show the floating gate 124 of each cell 10.

From the drawings of FIGS. 3, 3a and 3b, it may be seen that the floating gate 124 and control gate 128 of each cell 10 overlap each other along the sidewalls of the wells 50 thus increasing the capacitance between the two gates. It may furthermore be seen that the floating gate 124 overlaps the insulating material of the insulating trenches 200 along rows 20. Thus, while the capacitance between the floating gate 124 and control gate 128 is increased because they overlap each other along the four sidewalls of the well 50, the capacitive coupling between the floating gate 124 and the substrate 100 is not increased because they overlap each other only along two sidewalls of the well 50, i.e. along the source 152 and the drain 154.

Referring now to FIGS. 4 to 8, a method of forming the EEPROM device shown in the preceding figures will be described.

Figure 4:
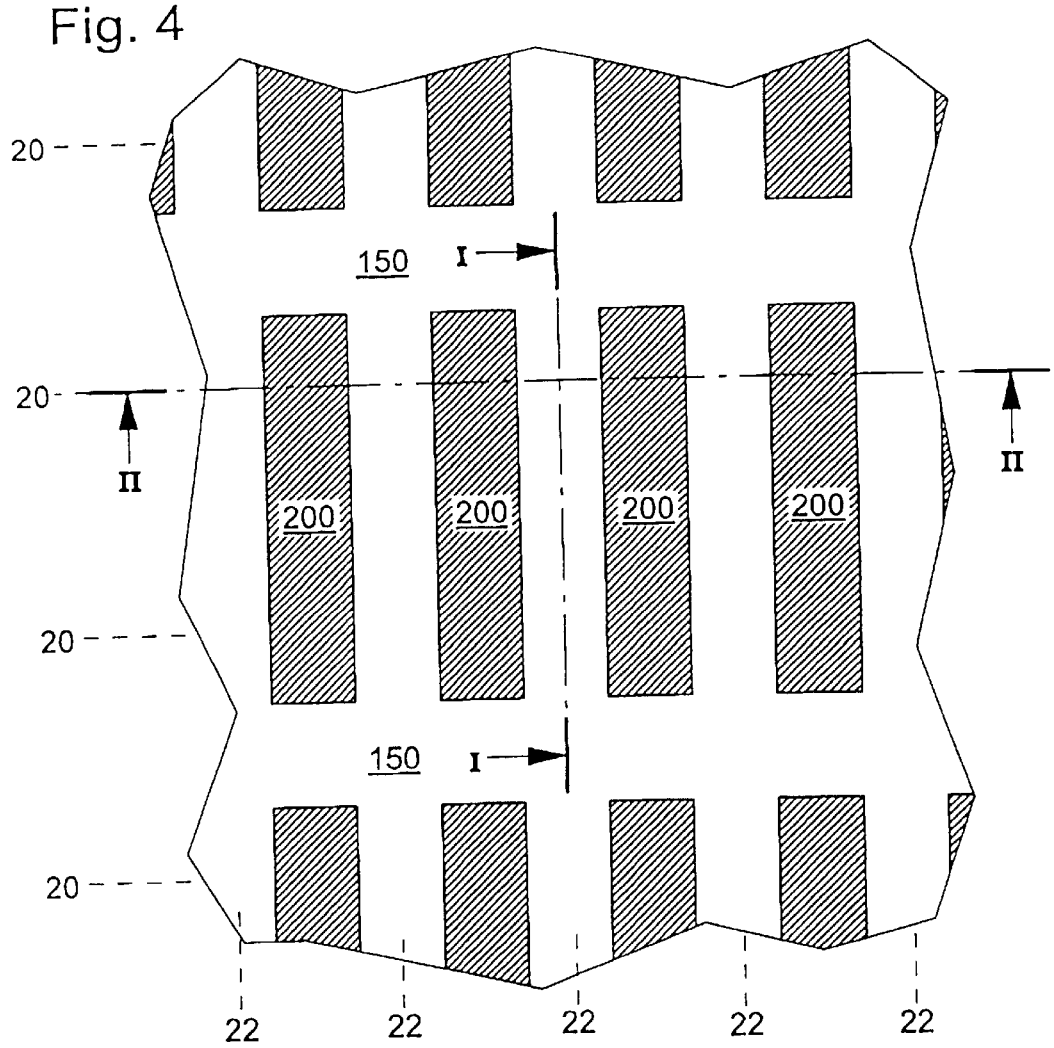
Figure 4A:
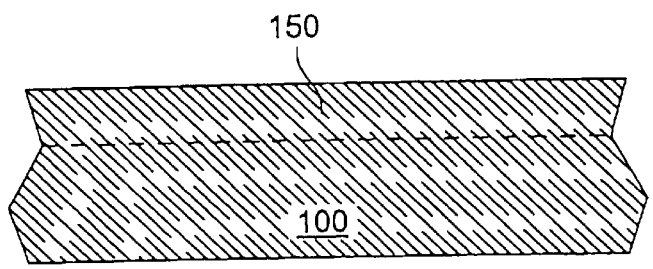
Figure 4B:
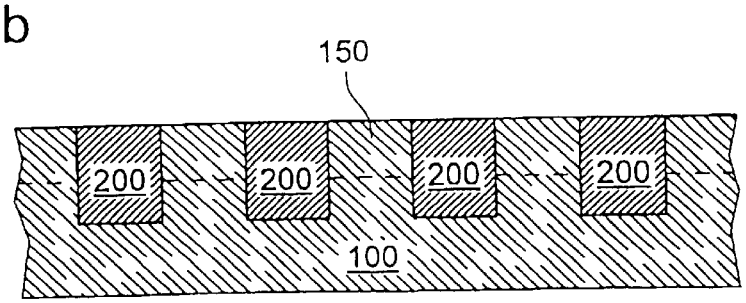

As shown in FIGS. 4, 4a and 4b, a blanket implant is performed resulting in the formation of a uniformly doped region 150 in the surface of the substrate 100, as shown in the cross-sectional views of FIGS. 4a and 4b taken respectively along lines I—I and II—II. Then, insulating trenches 200 which are deeper than the depth of the doped region 150 are formed in the semiconductor substrate 100. These insulating trenches 200 are typically formed by etching trenches in the substrate 100 and filling them with insulating material, e.g. silicon dioxide. As a result, a grid pattern, wherein insulating trenches 200 and doped regions 150 are alternated, is defined in the semiconductor substrate 100.

By performing a blanket implant at this early stage, no mask needs to be used to form the source and drain regions as these are subsequently defined by the formation of the insulating trenches 200 and wells 50. Furthermore, the implant is performed before any layer is deposited on the substrate. Accordingly, the damages induced by the implant are kept minimal.

Figure 5:
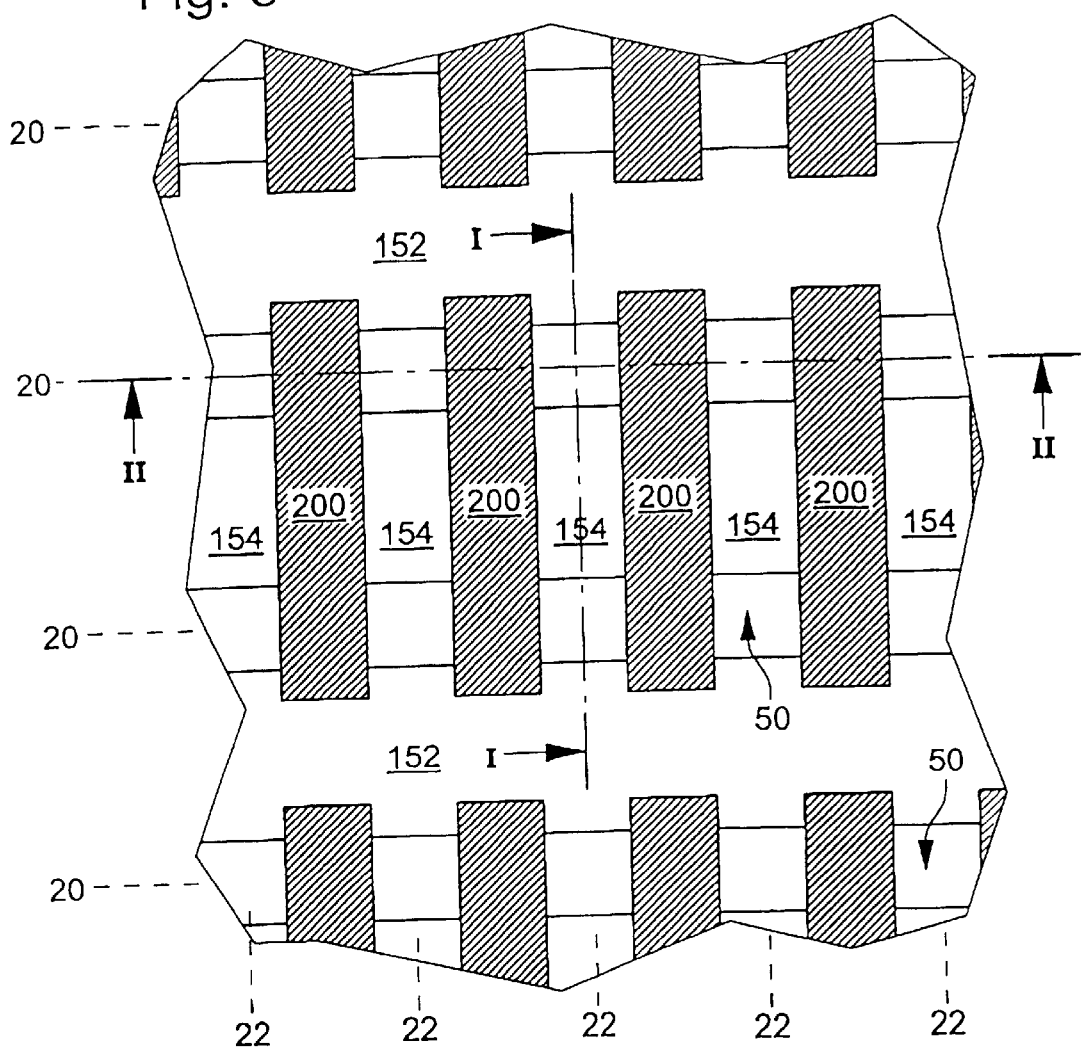
Figure 5A:
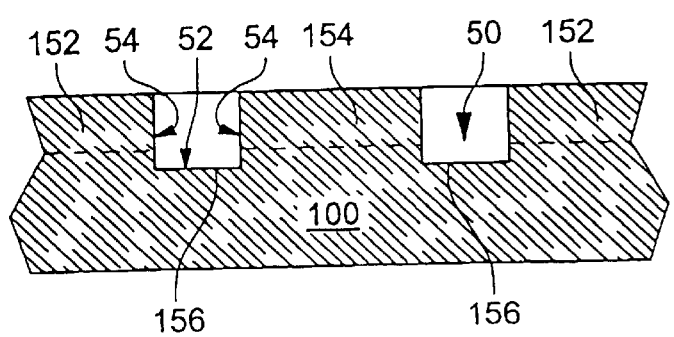
Figure 5B:
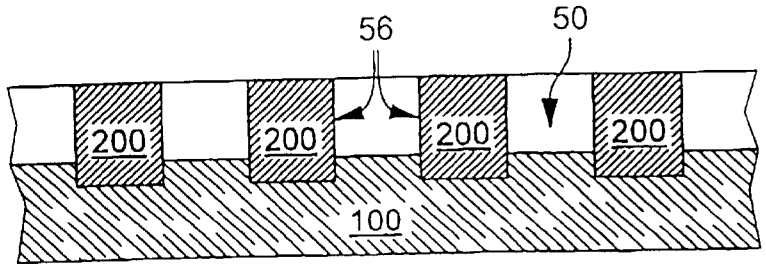

Next, as shown in FIG. 5, portions of the substrate 100 are selectively etched to form wells 50 between the insulating trenches 200. Such wells 50 are commonly formed by masking and patterning the surface of the substrate 100 and then etching the substrate 100 so as to form wells 50 having essentially vertical sidewalls. As shown in FIGS. 5a and 5b, wells 50 are formed to a depth which is greater than the depth of the doped region 150, so that the doped region 150 is separated into source 152 and drain 154 regions, a bottom surface 52 of the well 50 defining a channel 156 between source 152 and drain 154. Each well 50 thus comprises a first pair of facing sidewalls 54 adjacent to the source 152 and drain 154 and a second pair of facing sidewalls 56 adjacent to the insulating trenches 200.

After the formation of the wells 50, it is preferable to form a thin layer of oxide over the surface of the wells 50, then perform a high temperature annealing process in order to activate the implant, and finally strip the thin layer. These additional steps will substantially remove the damages or defects introduced on the surface of the wells 50 following the etching process.

Figure 6A:
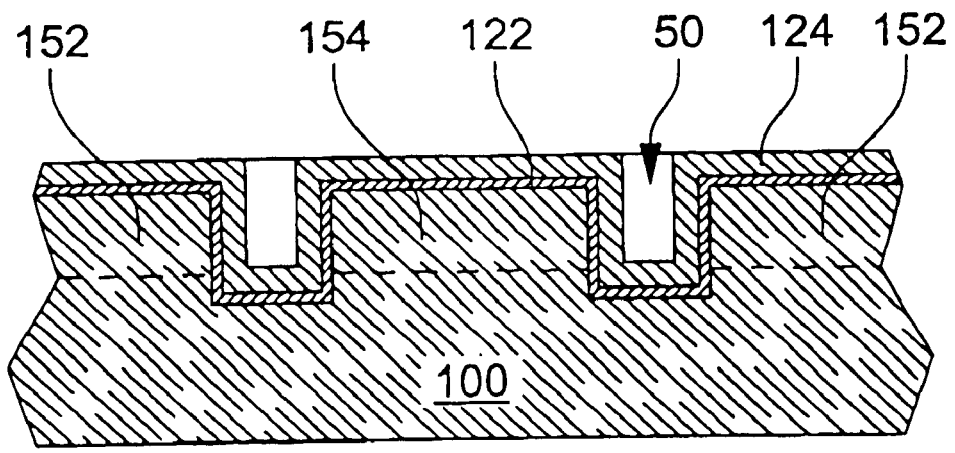
Figure 6B:
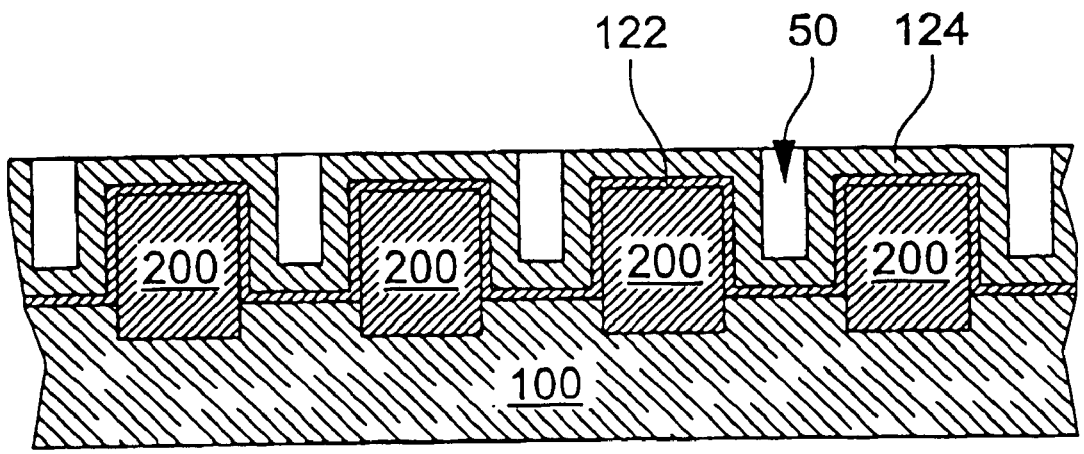

Next, as shown in FIGS. 6a and 6b, a first dielectric layer 122, which will ultimately form the tunnel oxide of the EEPROM cells 10, is suitably grown over the surface of the substrate and over the surface of the wells 50 by thermal oxidation. A first conductive layer 124, from which the floating gates of the EEPROM cells will ultimately be formed, is then deposited over the first dielectric layer 122. This conductive layer suitably comprises doped polycrystalline silicon and may be deposited by conventional CVD techniques.

Figure 7:
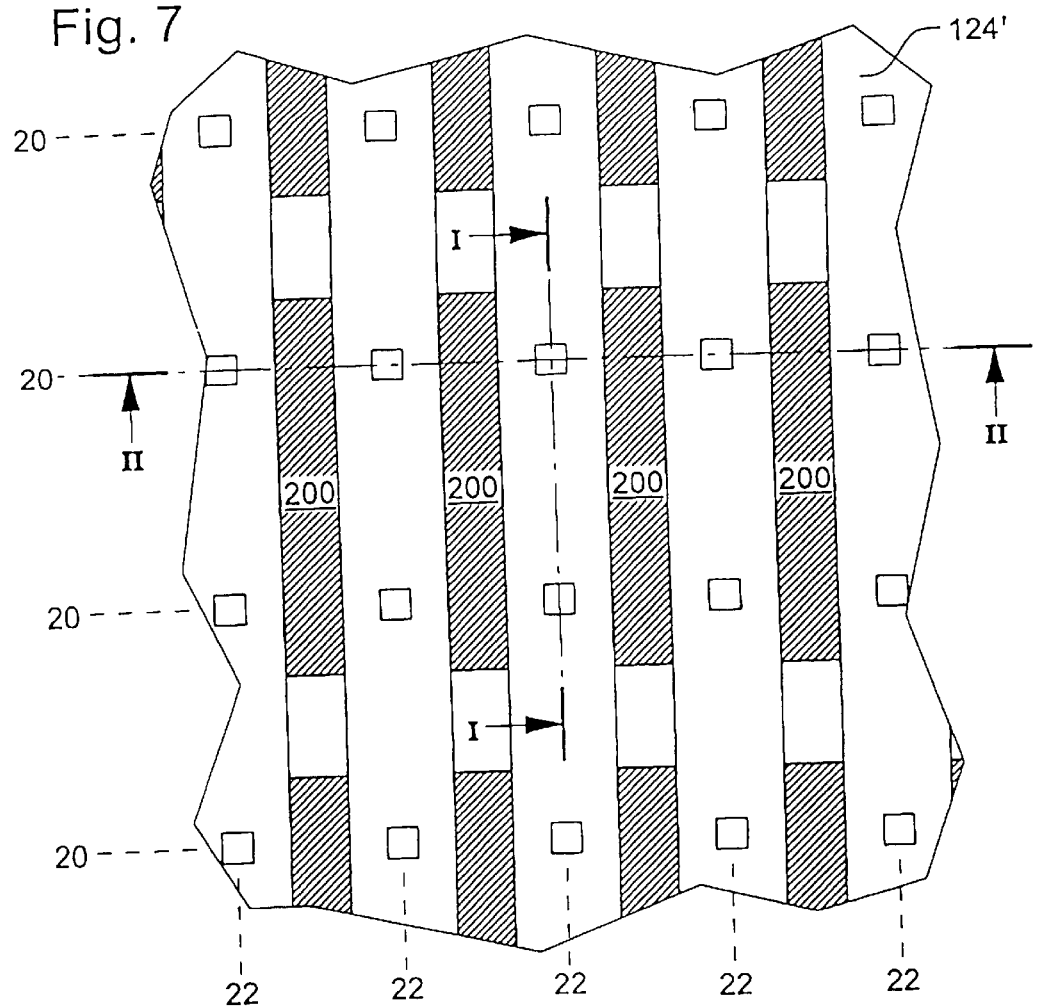
Figure 7A:
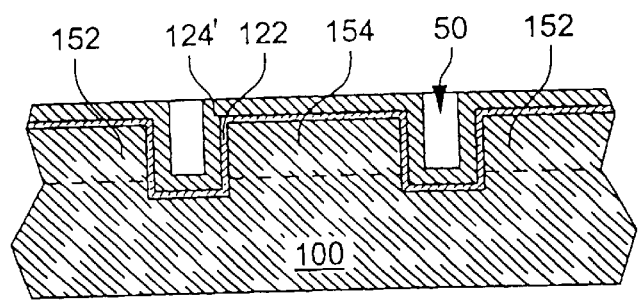
Figure 7B:
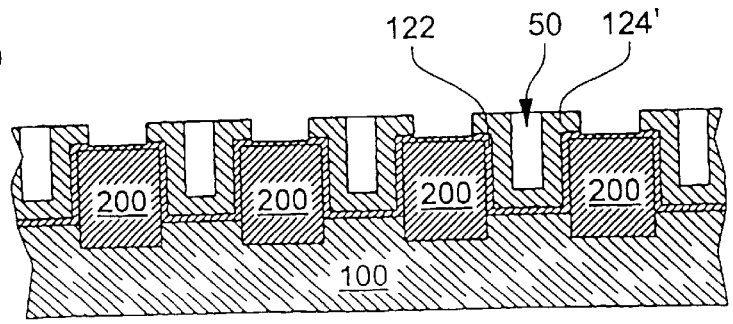

Next, with reference to FIGS. 7, 7a and 7b, portions of the first conductive layer 124 are then selectively removed in order to leave strips overlying the wells 50 along a direction parallel to columns 22. The portions of the first conductive layer 124 may be suitably removed by conventional masking and etching processes.

Figure 8A:
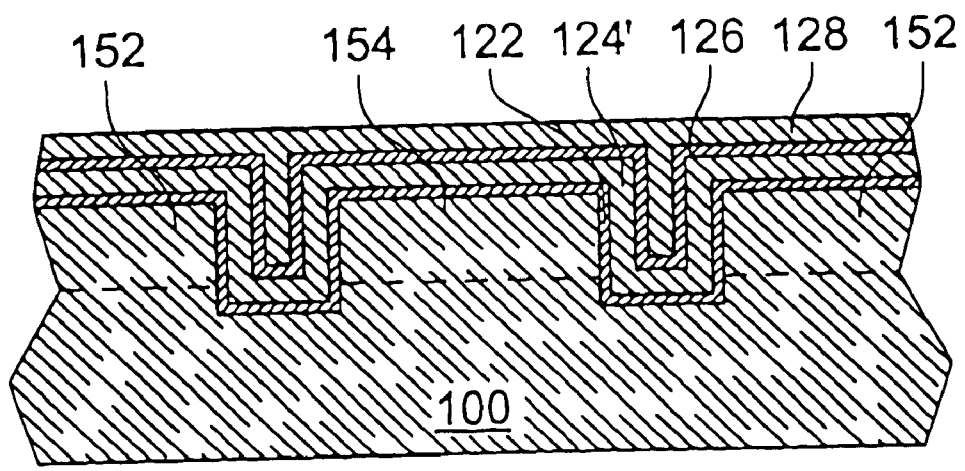
Figure 8B:
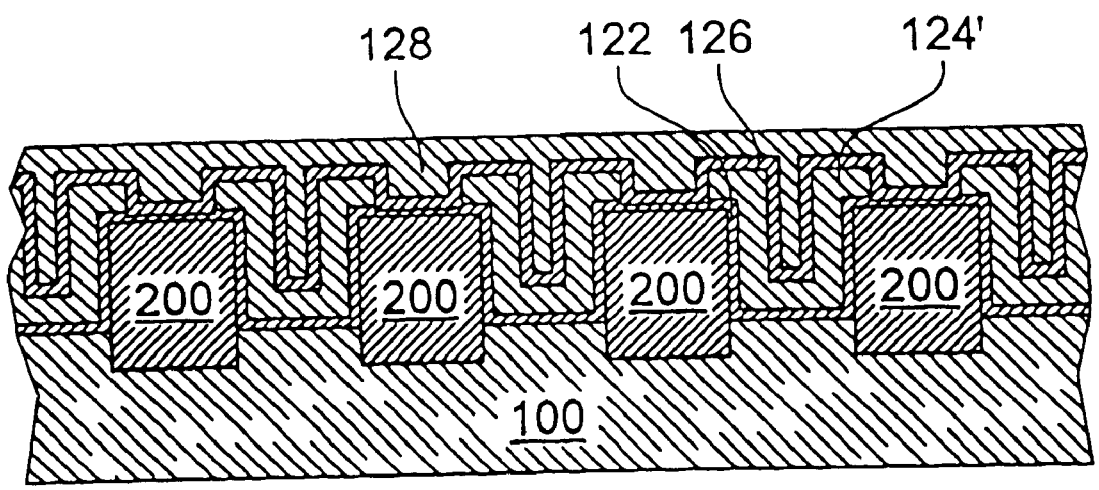

Then, as shown in FIGS. 8a and 8b, a second dielectric layer 126, such as an ONO (oxide-nitrite-oxide) layer, is formed overlying the first conductive layer 124. A second conductive layer 128, from which the control gates of the EEPROM cells will ultimately be formed, is then deposited over the dielectric layer 126 by any suitable technique, e.g. CVD.

The array of EEPROM cells is finally completed by removing portions of the first and second conductive layers 124 and 128 and the second dielectric layer 126 in order to form the gate structures 120 overlying the wells 50 along a direction parallel to rows 20. As a result, individual floating gates overlying the wells 50 are formed, and the control gates of each cells in rows 20 are formed integral to individual word lines WL. It is to be pointed out, that, in contrast to the prior art method, the etching processes which need to be performed to form the individual gate structures 120 are not critical because the first and second conductive layers 124 and 128 and the second dielectric layer 126 are etched at portions where they extend horizontally over the surface of the semiconductor substrate 100, and not inside a trench as this is the case in the prior art method. Accordingly, the likelihood that current leakage problems will occur is limited.

While the invention has been described with reference to specific embodiments, it should be clearly understood that various modifications will be apparent to and can readily be made by those skilled in the art without departing from the scope of the present invention. Accordingly, it is not intended that the present invention should merely be restricted to the specific embodiments described hereinabove but should also include features treated as equivalents thereof by those skilled in the art.

What is claimed is:

1. A method of forming a non-volatile semiconductor memory device, said non-volatile semiconductor memory device being formed of an array of memory cells organized into rows and columns within a semiconductor substrate, wherein the method comprises the steps of:

a) performing a blanket implant in the semiconductor substrate resulting in the formation of a uniformly doped region;

b) forming insulating trenches in said semiconductor substrate in a direction parallel to said columns;

c) forming wells in said semiconductor substrate between said insulating trenches, so as to define alternated source and drain regions along said columns, each of said wells having a bottom surface and having first and second pairs of facing sidewalls being respectively adjacent to said source and drain regions and to said insulating trenches;

d) forming a first dielectric layer over a surface of said semiconductor substrate and said wells;

e) forming a first conductive layer over said first dielectric layer;

f) removing portions of said first conductive layer, so as to leave strips of said first conductive layer overlying said wells in a direction parallel to said columns;

g) forming a second dielectric layer over said first conductive layer;

h) forming a second conductive layer over said second dielectric layer; and i) removing portions of said first and second conductive layers and said second dielectric layer, so as to define gate structures overlying said wells along said rows, resulting in the formation of individual floating gates and control gates overlying said wells, the control gates of each cell within a row being formed integral to a word line.

2. A method according to claim 1, said method further comprising, directly following the formation of said wells according to step c), the steps of:

aa) forming a thin layer of oxide over the surface of said wells;

bb) performing a high temperature annealing process; and cc) stripping said thin layer of oxide.

3. A method according to claim 1 or 2, wherein said insulating trenches are interrupted at periodic intervals so that the source regions of the memory cells form a common source line.

* * * * *